(12) United States Patent
Wu et al.

(10) Patent No.: US 9,093,176 B2
(45) Date of Patent: Jul. 28, 2015

(54) POWER LINE LOWERING FOR WRITE ASSISTED CONTROL SCHEME

(71) Applicant: Taiwan Semiconductor Manufacturing Co. Ltd., Hsin-Chu (TW)

(72) Inventors: Wei-Cheng Wu, Hsinchu (TW); Wei Min Chan, Sindian (TW); Yen-Huei Chen, Jhudong Township (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 318 days.

(21) Appl. No.: 13/674,192

(22) Filed: Nov. 12, 2012

(65) Prior Publication Data

US 2014/0133219 A1    May 15, 2014

(51) Int. Cl.
*G11C 11/419*    (2006.01)
*G11C 11/4197*   (2006.01)

(52) U.S. Cl.
CPC .................................... *G11C 11/419* (2013.01)

(58) Field of Classification Search
CPC ....................................................... G11C 11/419
USPC ............................. 365/154, 189.16, 190, 226
See application file for complete search history.

(56) References Cited

U.S. PATENT DOCUMENTS

| 7,952,939 | B2 | 5/2011 | Chen et al. | |
| 2007/0263447 | A1* | 11/2007 | Koike et al. | 365/185.18 |
| 2009/0109733 | A1* | 4/2009 | Wong | 365/154 |
| 2009/0116308 | A1* | 5/2009 | Van Winkelhoff et al. | 365/189.14 |

* cited by examiner

*Primary Examiner* — Hoai V Ho
*Assistant Examiner* — Jay Radke
(74) *Attorney, Agent, or Firm* — Eschweiler & Associates, LLC (57) ABSTRACT

Some embodiments of the present disclosure relate to a memory array having a cell voltage generator configured to provide a cell voltage header to a plurality of memory cells. The cell voltage generator is connected to the memory cells by way of supply voltage line and controls a supply voltage of the memory cells. The cell voltage generator has a pull-down element coupled between a control node of the supply voltage line and a ground terminal, and a one or more pull-up elements connected in parallel between the control node and a cell voltage source. A control unit is configured to provide one or more variable valued pull-up enable signals to input nodes of the pull-up elements. The variable valued pull-up enable signals operate the pull-up elements to selectively connect the supply voltage line from the cell voltage source to provide a cell voltage header with a high slew rate.

19 Claims, 5 Drawing Sheets

POWER LINE LOWERING FOR WRITE ASSISTED CONTROL SCHEME

BACKGROUND

Integrated chips used in modern electric devices (e.g., computers, cell phones, televisions, etc.) contain memory that stores data and/or programs. During operation, an integrated chip can access the data and/or programs stored in memory. Once accessed, the programs can be executed by a processing unit (e.g., a CPU) to perform a function for a user.

One common form of memory that is widely used in modern day integrated chips is static random access memory (SRAM). SRAM is a volatile memory that stores data in a latch type structure comprising cross-coupled inverters. During a write operation, bit lines are configured to write data (e.g., a "0" or a "1") into an SRAM cell. During a read operation, bit lines are configured to receive data from the SRAM cell.

DETAILED DESCRIPTION

One or more implementations of the present disclosure will now be described with reference to the attached drawings, wherein like reference numerals are used to refer to like elements throughout. The drawings are not necessarily drawn to scale.

Figure 1A:
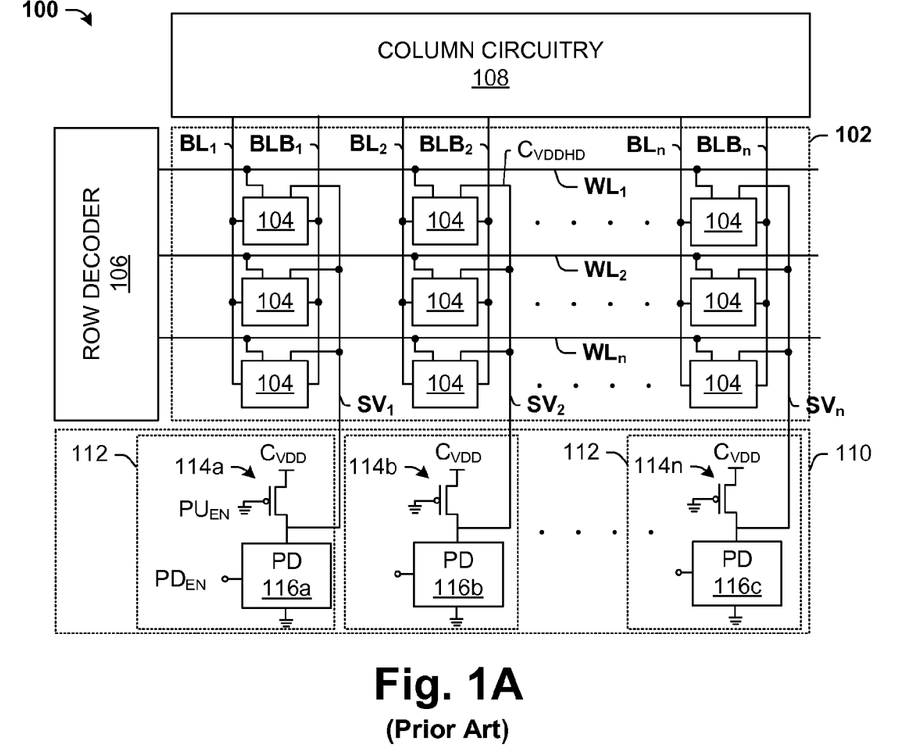
FIG. 1A illustrates a block diagram of an exemplary SRAM array.

FIG. 1A illustrates a block diagram of a static random access memory (SRAM) array 100. The SRAM array 100 comprises a memory core 102 having a plurality of memory cells 104, respectively having semiconductor devices in a latch structure configured to store a bit of data. Each memory cell 104 is in communication with periphery control circuitry configured to control access to data within the memory core 102. The periphery control circuitry comprises a row decoder 106, a column circuitry 108, and a cell voltage generator 110.

The row decoder 106 is connected to the memory cells 104 by way of a plurality of wordlines $WL_1, \ldots, WL_n$ and is configured to control access to a memory cell 104 by sending signals to the memory cell 104 by way of one of the plurality of wordlines. The column circuitry 108 is connected to the memory cells 104 by way of a plurality of bitline BL and bitline bar BLB pairs and is configured to convey data to/from the memory cells 104. The cell voltage generator 110 is connected to the memory cells by way of a supply voltage line SV and is configured to provide a cell voltage header $C_{VDDHD}$ that acts as a supply voltage for the memory cells 104.

As the size of SRAM cells decrease, processing variations increasingly cause large device mismatches within the SRAM cells in advanced technology nodes. Such device mismatches may cause write failures in the SRAM cells. To improve the ability to write data to an SRAM array (e.g., to help a memory cell to "flip" its state during a write operation) write assist techniques have become commonly used. One such write assist technique decreases supply voltage of a memory cell 104 to improve writeability. To decrease the supply voltage, the cell voltage generator 110 comprises a plurality of voltage regulation blocks 112 configured to control the cell voltage header $C_{VDDHD}$ on the supply voltage lines SV. Each of the voltage regulation blocks 112 comprises a pull-up PMOS transistor 114 connected in series with a pull-down element 116. Respective pull-up PMOS transistors 114 have a gate connected to a ground terminal, such that the gates receive a constant pull-up enable signal that constantly provide charges from the supply voltage $C_{VDD}$ to a supply voltage line SV.

Figure 1B:
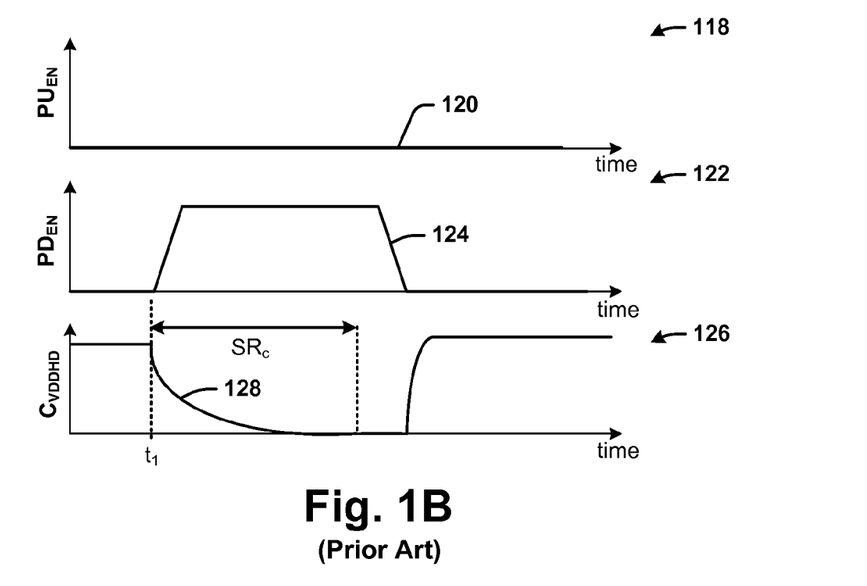
FIG. 1B shows graphs of signals corresponding to a write access of the SRAM array.

FIG. 1B shows graphs (118, 122, 126) of signals corresponding to a write access of a SRAM memory cell. As shown in graph 118, the pull-up enable signal 120 has a constant value of "0". As shown in graph 122, at a first time $t_1$ a pull-down enable signal 124 provided to the pull-down element is raised, causing the pull-down element 116 to connect the supply voltage line SV to the ground terminal. As shown in graph 126, connecting the supply voltage line SV to the ground terminal causes the cell voltage header 128 on the supply voltage line SV (and therefore the supply voltage of a memory cell) to slowly decrease at a slew rate $SR_c$. By decreasing the supply voltage of a memory cell, the memory cell writeability is improved to overcome device mismatches within the SRAM cell (e.g., when the supply voltage line reaches target potential, pull-up transistor is weakened and a strong "0" from BL will cause a data flip to occur in the memory cell). However, using a lower bit cell power causes current fighting between the pull-up and pull-down elements, reducing the write speed (e.g., slew rate of $C_{VDDHD}$) of an SRAM cell.

Accordingly, the present invention relates to a memory array having a cell voltage generator configured to provide a cell voltage header $C_{VDDHD}$ with a high slew rate (i.e., short write speed). In some embodiments, the disclosed memory array a plurality of memory cells configured to store data. A cell voltage generator, connected to the memory cells by way of one or more supply voltage lines, is configured to control the supply voltage of the memory cells. The cell voltage generator comprises a pull-down element coupled between a control node of a supply voltage line and a ground terminal, and a one or more pull-up elements connected in parallel between the control node and a cell voltage source. A control unit is configured to provide one or more variable valued pull-up enable signals to input nodes of the one or more pull-up elements. The variable valued pull-up enable signals operate the one or more pull-up elements to selectively connect or disconnect the supply voltage line from the cell voltage source to reduce current fighting between the cell voltage source and the ground terminal, thereby providing a cell voltage header with a high slew rate.

Figure 2:
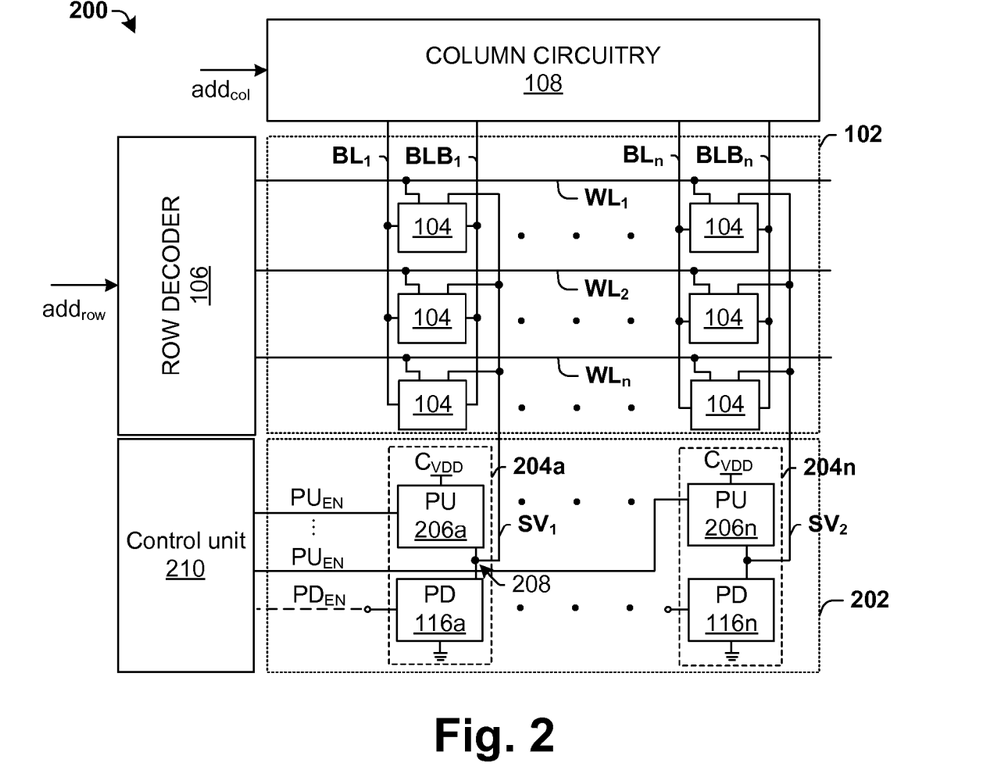
FIG. 2 illustrates a block diagram of some embodiments of a memory array having a cell voltage generator configured to provide a cell voltage header with a high slew rate.

FIG. 2 illustrates a block diagram of some embodiments of a memory array 200 having a cell voltage generator 202 configured to provide a cell voltage header $C_{VDDHD}$ with a high slew rate. It will be appreciated that although the cell voltage generator 202 provided herein is described in relation to an SRAM memory array, that the disclosed cell voltage generator 202 is not limited to SRAM memory arrays, but may also be used in other types of memory arrays (e.g., DRAM, etc.).

The memory array 200 comprises a memory core 102 having a plurality of memory cells 104 configured to store data. The memory cells 104 are disposed in a grid type architecture having a plurality of wordlines $WL_1, \ldots, WL_n$ and bitlines $BL_1, \ldots, BL_n$. The plurality of wordlines $WL_1, \ldots, WL_n$ are connected to a row decoder 106 configured to receive a row address $add_{row}$ of a memory cell to be accessed (e.g., written to or read from) and based thereupon to activate a corresponding wordline. The plurality of bitlines $BL_1, \ldots, BL_n$ are connected to a column circuitry 108 comprising one or more sense amplifiers and a column decoder, for example. The column circuitry 108 is configured to receive a column address $add_{col}$ and to provide data to be written to or to receive data to be read from a memory cell 104 associated with the column address $add_{col}$.

The plurality of memory cells 104 are further coupled to the cell voltage generator 202 configured to regulate a cell voltage header $C_{VDDHD}$, which is provided as a supply voltage for the plurality of memory cells 104. The cell voltage generator 202 comprises a plurality of voltage regulation blocks $204a, \ldots, 204n$. The plurality of voltage regulation blocks $204a, \ldots, 204n$ are connected to one or more memory cells 104 by way of a supply voltage line SV that is configured to provide the cell voltage header $C_{VDDHD}$ to the memory cells 104.

Each voltage regulation block 204 comprises a pull-up network 206 and a pull-down element 116. The pull-up network 206 comprises one or more pull-up elements (e.g., P-type metal-oxide-semiconductor transistors) positioned between a control node 208 and a cell voltage source $C_{VDD}$. The pull-up network 206 is configured to selectively provide power from the cell voltage source $C_{VDD}$ to the supply voltage line SV. The pull-down element 116 is positioned between the control node 208 and a ground terminal. The pull-down element 116 is configured to selectively provide charges from the supply voltage line SV to the ground terminal.

A control unit 210 is connected to input nodes of the one or more pull-up elements within the pull-up network 206. The control unit 210 is configured to provide one or more pull-up enable signals $PU_{EN}$ to the pull-up network 206. The one or more pull-up enable signals $PU_{EN}$ operate the one or more pull-up elements within the pull-up network 206 to selectively connect the control node 208 to the cell voltage source $C_{VDD}$. In some embodiments, the control unit 210 is further configured to provide a pull-down enable signal $PD_{EN}$ to the pull-down elements 116. The pull-down enable signal $PD_{EN}$ operates the pull-down elements 116 to selectively connect the control node 208 to the ground terminal. In other embodiments, a separate control unit is configured to provide a pull-down enable signal $PD_{EN}$ to the pull-down elements 116.

In some embodiments, the control unit is configured to output a variable valued pull-up enable signals $PU_{EN}$ and/or a variable valued pull-down enable signal $PD_{EN}$. The variable valued pull-up enable signal has a value that changes over time between a first value and a second value, which control the connectivity between the control node 208 and a cell voltage source $C_{VDD}$. For example, for a pull-up network 206 having a single pull-up element, the first value (e.g., a low value) may operate the pull-up network 206 to couple the control node 208 to the cell voltage source $C_{VDD}$, and the second value (e.g., a high value) may operate the pull-up network 206 to disconnect the control node 208 from the cell voltage source $C_{VDD}$. By operating the pull-up network 206 to selective connect and disconnect the control node 208 to/from the supply voltage $C_{VDD}$, the control unit 210 is able to more quickly reduce the voltage on the supply voltage line, thereby increasing the slew rate of the memory array 200.

Figure 3:
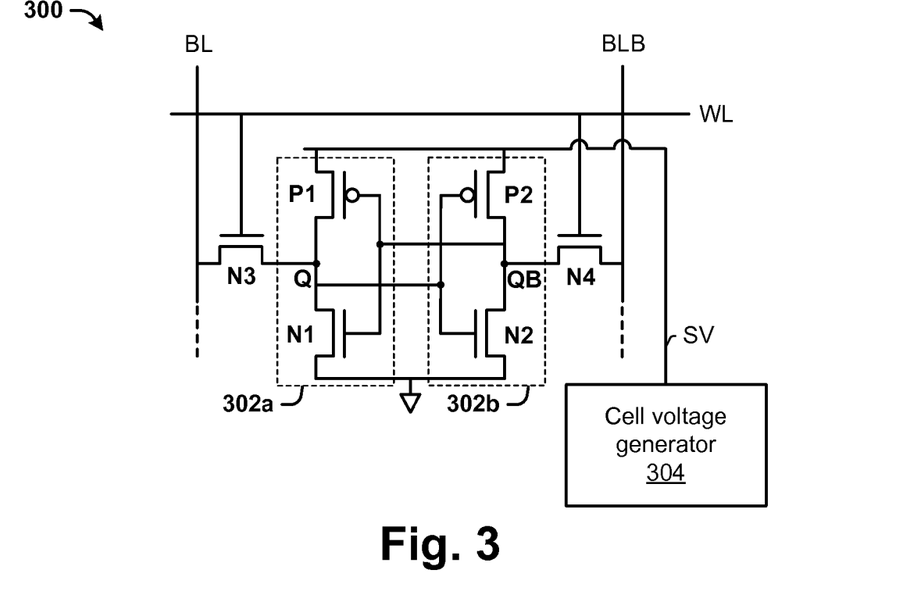
FIG. 3 illustrates some embodiments of a circuit diagram of an SRAM memory cell connected to a disclosed cell voltage generator.

In some embodiments, the disclosed memory array 200 may comprise an SRAM memory array. In such an embodiments, the supply voltage line SV is connected to a supply voltage of the SRAM array. For example, FIG. 3 illustrates some embodiments of a circuit diagram of an SRAM memory cell 300 connected to a disclosed cell voltage generator 304.

The SRAM memory cell 300 comprises a pair of cross-coupled inverters, 302a and 302b, which form a latching storage element configured to store a bit of information. The first inverter 302a comprises a pull-up P-type metal-oxide-semiconductor (PMOS) transistor P1 connected in series with a pull-down N-type metal-oxide-semiconductor (NMOS) transistor N1 at a first data storage node Q, which is connected to a bitline BL by way of a first NMOS access transistor N3 having a gate connected to a wordline WL. The second inverter 302b comprises a pull-up PMOS transistor P2 connected in series with a pull-down NMOS transistor N2 at a second data storage node QB, which is connected to a bitline BLB by way of a second NMOS access transistor N4 having a gate connected to the wordline WL. The first and second NMOS access transistors N2 and N4 are configured to control access to the SRAM memory cell 300 during read and write operations.

The source terminal of the pull-up PMOS transistors, P1 and P2, are connected to a supply voltage line SV that is coupled to the cell voltage generator 304. By connecting the supply voltage line SV to the cell voltage generator 304, the supply voltage is set equal to a cell voltage header $C_{VDDHD}$ set by the cell voltage generator 304. This allows for the cell voltage generator 304 to control the supply voltage of the SRAM memory cell 300. For example, during write operations the cell voltage generator 304 is able to reduce the supply voltage of the SRAM memory cell 300 to improve writing data to the SRAM memory cell 300, while during read operations the cell voltage generator 304 is able to increase the supply voltage of the SRAM memory cell 300 to improve reading data from the SRAM memory cell 300.

Figure 4A:
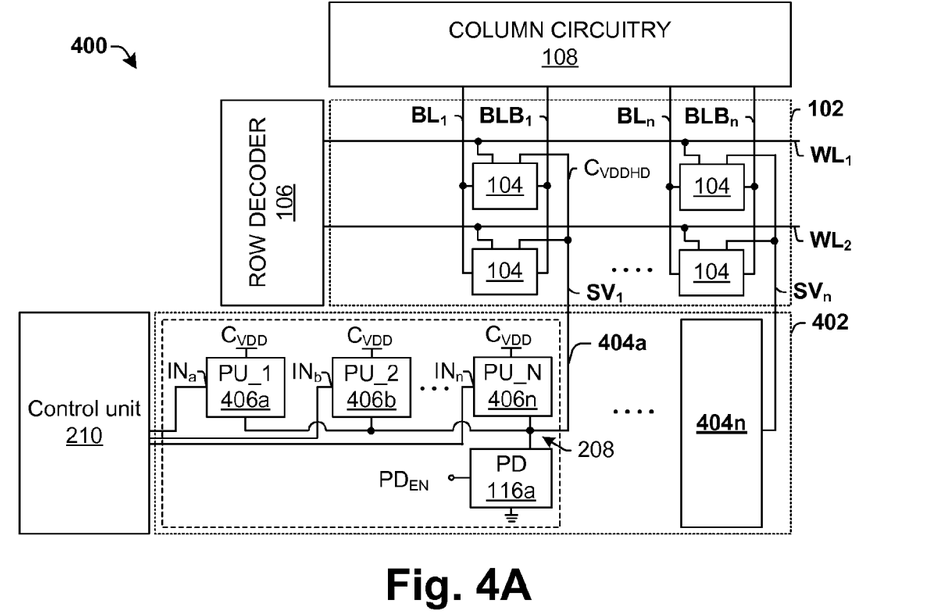
FIGS. 4A-4B illustrate some embodiments of a SRAM array having a cell voltage generator configured to provide a cell voltage header with a high slew rate.

FIG. 4A illustrate some embodiments of a SRAM array 400 having a cell voltage generator 402 configured to provide a cell voltage header $C_{VDDHD}$ with a high slew rate.

The SRAM array 400 comprises a cell voltage generator 402 having a plurality of voltage regulation blocks $404a, \ldots, 404n$ configured to control the voltage on the supply voltage lines $SV_1, \ldots, SV_n$. Each voltage regulation block 404 comprises a pull-down element 116 and a plurality of pull-up elements 406. The pull-down element 116 is coupled between a control node 208 of a supply voltage line (e.g., $SV_1$) and a ground terminal. The plurality of pull-up elements 406 are connected in parallel between the control node 208 and a cell voltage source $C_{VDD}$. For example, in SRAM array 400 a first pull-up element 406a is connected between the control node 208 and a cell voltage source $C_{VDD}$, a second pull-up element 406b is connected in parallel to the first pull-up element 406a and between the control node 208 and a cell voltage source $C_{VDD}$, etc.

Each of the plurality of pull-up elements $406a, \ldots, 406n$ have an input node $IN_a, \ldots, IN_n$ configured to control operation of a respective pull-up element. The input nodes $IN_a, \ldots, IN_n$ are connected to the control unit 210, which is configured to provide separate pull-up enable signals $PU_{EN1}, \ldots, PU_{ENn}$ to each of the plurality of pull-up elements $406a, \ldots, 406n$ within a pull-up network. In some embodiments, the separate pull-up enable signals $PU_{EN1}, \ldots, PU_{ENn}$ have different pulse widths. For example, a first pull-up enable signal $PU_{EN1}$ may have a first pulse width, a second pull-up enable signal $PU_{EN2}$ may have a second pulse width, etc. In some embodiments, the pull-up enable signals $PU_{EN1}, \ldots, PU_{ENn}$ are configured to activate the plurality of pull-up elements $406a, \ldots, 406n$ at a same time (e.g., pull up enable signals are raised from a low value to a high value at a same time) so that the different pulse widths cause the pull-up enable signals $PU_{EN1}, PU_{ENn}$ to deactivate the plurality of pull-up elements $406a, \ldots, 406n$ in a sequential manner (e.g., pull up enable signals are lower from a low value to a high value at sequential times). For example, the first pull-up enable signal $PU_{EN1}$ will deactivate the first pull-up element 406a at a first time, while the second pull-up enable signal $PU_{EN2}$ will deactivate the second pull-up element 406b at a second time, after the first time. By varying the pulse widths of the pull-up enable signals $PU_{EN1}, \ldots, PU_{ENn}$ in such a manner, the voltage on the supply voltage line SV can be decreased in a smooth manner.

Figure 4B:
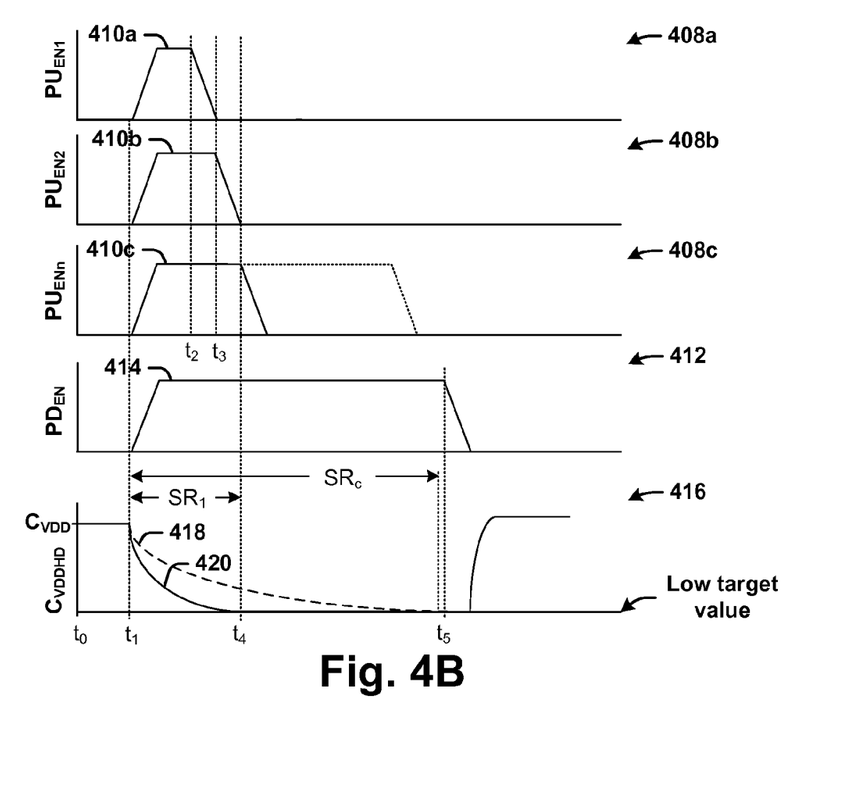

For example, FIG. 4B shows graphs of signals corresponding to a write access of the SRAM array 400. Graphs 408a-408c illustrate the pull-up enable signals 410a-410c provided to the plurality of pull-up elements $406a, \ldots, 406n$ (y-axis) as a function of time (x-axis). Graph 412 illustrates a pull-down enable signal 414 provided to the pull-down element 116 (y-axis) as a function of time (x-axis). Graph 416 illustrates a cell voltage header 420 on the supply voltage line connected to an SRAM cell (y-axis) as a function of time (x-axis).

Although FIG. 4B illustrates pull-up enable signals having a high value as connecting the cell voltage source to the control node and pull-down enable signals having a high value as disconnecting the control node from a ground terminal, one of ordinary skill in the art will appreciate that such values are only an example and are not limiting. For example, in other embodiments, a pull-up enable signal having a low value can disconnect the cell voltage source from the control node.

At a time $t_0$, the pull-up enable signals 410a-410c and the pull-down enable signal 414 have a low value (graphs 408a-408c and 412). The low value causes the pull-up elements 406a-406n to connect the cell voltage source $C_{VDD}$ to the control node 208 and the pull-down element 116 to disconnect the ground terminal from the control node 208. The resulting cell voltage header 420 (graph 416) is $C_{VDD}$.

At a time $t_1$, the pull-up enable signals 410a-410c and the pull-down enable signal 414 are raised from a low value to a high value. As the pull-up enable signals 410a-410c are raised, the pull-up elements 406a-406n are operated to disconnect the cell voltage source $C_{VDD}$ from the control node 208. As the pull-down enable signal 414 is raised, the pull-down element 116 is operated to connect the ground terminal to the control node 208. Since the control node 208 is connected to the ground terminal and disconnected from the cell voltage source $C_{VDD}$, the cell voltage header 420 on the supply voltage line begins to drop from a value $C_{VDD}$ to a lower target value.

At a time $t_2$, the first pull-up enable signal 410a provided to the first pull-up element 406a begins to drop from a high value to a low value. For example, as shown in graph 408a, the first pull-up enable signal 410a drops from a high value to a low value, while the remainder of the pull-up enable signals 410b-410c remain high. Reducing the value of the first pull-up enable signal 410a reduces the rate at which the cell voltage header 420 is reduced.

At a time $t_3$, the second pull-up enable signal 410b provided to the second pull-up element 406b begins to drop from a high value to a low value. For example, as shown in graph 408b, the second pull-up enable signal 410b drops from a high value to a low value, while the last pull-up enable signal 410c remains high. Reducing the value of the second pull-up enable signal 410b further reduces the rate at which the cell voltage header 420 is reduced.

At a time $t_4$, the cell voltage header 420 reaches the low target value and the last pull-up enable signal 410c provided to the third pull-up element 406c begins to drop from a high value to a low value. For example, as shown in graph 408c, the last pull-up enable signal 410c drops so that the pull-up elements $406a, \ldots, 406n$ have reconnected the cell voltage source $C_{VDD}$ to the control node.

By controlling the pull-up elements with the pull-up enable signals 410a-410c, the slew rate of the cell voltage header 420 is increased. For example, the slew rate of the cell voltage header 420 according to the disclosed cell voltage generator 402 is shown as $SR_1$ and is smaller than the slew rate of the cell voltage header 418 of a conventional cell voltage generator (e.g., element 110 in FIG. 1A), which is shown as $SR_c$.

At time $t_5$, the pull-down enable signal 414 begins to drop from a high value to a low value. As the pull-down enable signal 414 begins to drop, the control node is disconnected from the ground terminal and the cell voltage header 420 returns to the value of the cell voltage source $C_{VDD}$.

Figure 5A:
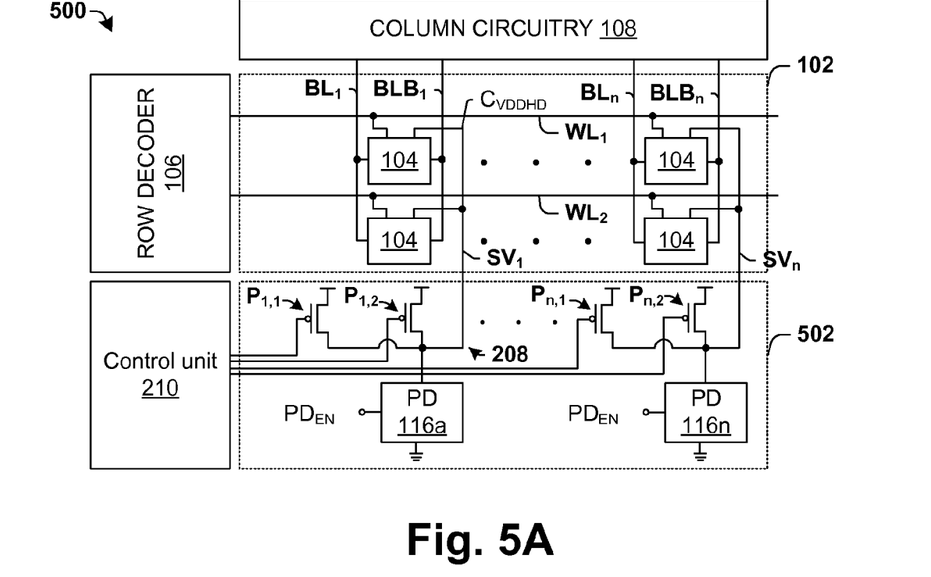
FIGS. 5A-5B illustrate some alternative embodiments of a SRAM array having a cell voltage generator configured to provide a cell voltage header with a high slew rate.

FIG. 5A illustrates a block diagram of some embodiments of an SRAM array 500 having a supply voltage generator 502 configured to provide a cell voltage header $C_{VDDHD}$ with a high slew rate.

In supply voltage generator 502, the pull-up elements comprise PMOS transistors. For example, a first voltage regulator block has a first PMOS transistor $P_{1,1}$ and a second PMOS transistor $P_{1,2}$. The first and second PMOS transistors, $P_{1,1}$ and $P_{1,2}$, have a source connected to a supply voltage $C_{VDD}$ and a drain connected to a control node 208. The PMOS transistors, $P_{1,1}$ and $P_{1,2}$, further comprise gates configured to receive pull-up enable signals, $PU_{EN1}$ and $PU_{EN2}$ respectively, from a control unit 210. Upon a change in the value of a pull-up enable signal, the first or second PMOS transistors, $P_{1,1}$ or $P_{1,2}$, will connect or disconnect the cell voltage source $C_{VDD}$ to or from the control node 208 of the supply voltage line $SV_1$.

In some embodiments, the first and second PMOS transistors, $P_{1,1}$ and $P_{1,2}$, have different gate widths. By providing different gate widths to the first and second PMOS transistors, $P_{1,1}$ and $P_{1,2}$, the source drain current provided by each transistor can be varied to provide for better control current flowing from the cell voltage source $C_{VDD}$ to the control node 208

Figure 5B:
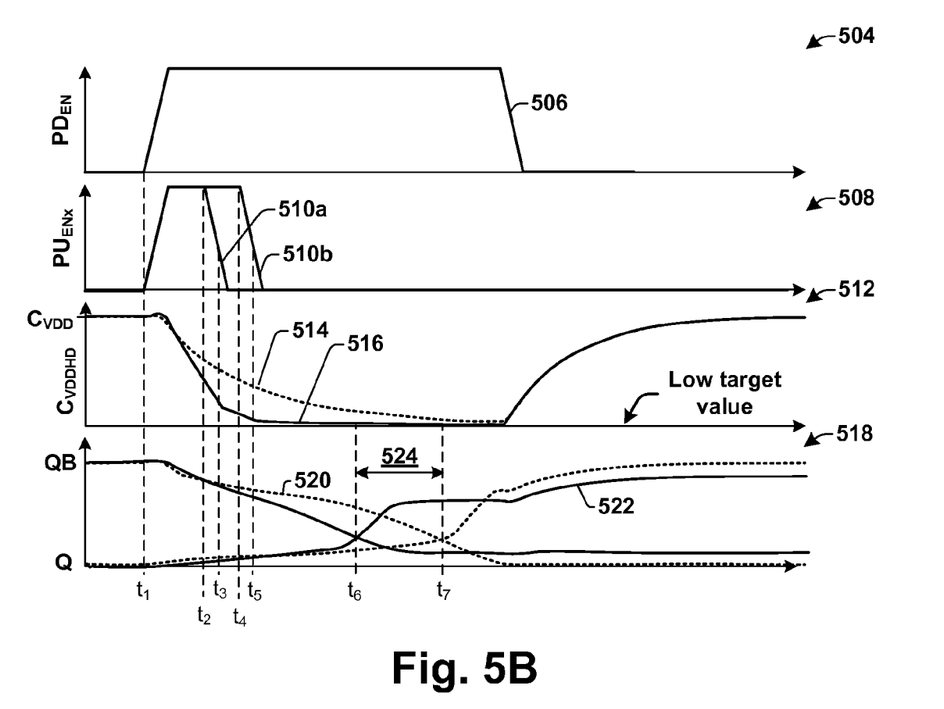

FIG. 5B shows graphs (504, 508, 512, and 518) of signals corresponding to a write access of the SRAM array 500. Graphs 504 illustrates a pull-down enable signal 506 provided to the pull-down element 116 (y-axis) as a function of time (x-axis). Graph 508 illustrates first and second pull-up enable signals 510a and 510b provided to PMOS transistors $P_{1,1}$ and $P_{1,2}$ (y-axis) as a function of time (x-axis). Graph 512 illustrates a cell voltage header 516 on the supply voltage line connected to an SRAM cell (y-axis) as a function of time (x-axis). Graph 518 illustrates data states 522 at nodes Q sand QB in an SRAM cell (y-axis) as a function of time (x-axis).

At a time $t_1$, a first pull-up enable signal 510a, a second pull up enable signal 510b, and the pull-down enable signal 506 are raised from a low value to a high value, disconnecting the cell voltage source $C_{VDD}$ from the control node 208 and connecting the ground terminal to the control node 208. Since the control node 208 is connected to the ground terminal and disconnected from the supply voltage, the cell voltage header on the supply voltage line SV begins to drop from a value $C_{VDD}$ to a lower target value.

From time $t_1$ to time $t_3$, the cell voltage header $C_{VDDHD}$ is reduced at a first rate having a first slope value. At a time $t_2$, the first pull-up enable signal $PU_{EN1}$ 510a provided to the first PMOS transistors $P_{1,1}$ begins to drop from a high value to a low causing the first PMOS transistors $P_{1,1}$ to connect the cell voltage source $C_{VDD}$ to the control node 208. Connecting the cell voltage source $C_{VDD}$ to the control node 208 causes the rate at which the cell voltage header $C_{VDDHD}$ is changed to a second slope value that is less than the first slope value at time $t_3$.

From time $t_3$ to time $t_5$, the cell voltage header $C_{VDDHD}$ is reduced at a rate having the second slope value. At a time $t_4$, the first pull-up enable signal $PU_{EN2}$ 510b provided to the second PMOS transistors $P_{1,2}$ begins to drop from a high value to a low causing the second PMOS transistors $P_{1,2}$ to connect the cell voltage source $C_{VDD}$ to the control node 208. Connecting the cell voltage source $C_{VDD}$ to the control node 208 further reduces the rate at which the cell voltage header $C_{VDDHD}$ is reduced at time $t_5$.

At a time $t_6$, the cell voltage header 516 reaches a sufficiently low value to cause the data states 522 in an associated SRAM cell to flip. In comparison, the cell voltage header value 514 in a conventional SRAM cell (e.g., shown in FIG. 1A) reaches the low target value at a later time $t_7$ so that the data states 520 in an associated SRAM cell are flipped at a later time $t_7$. Therefore, by controlling the pull-up elements with the pull-up enable signals, the slew rate of the cell voltage header is increased and the data state in the SRAM cell is flipped at an earlier time, thereby providing for a write speed improvement of 524 (e.g., 100 pS).

Figure 6:
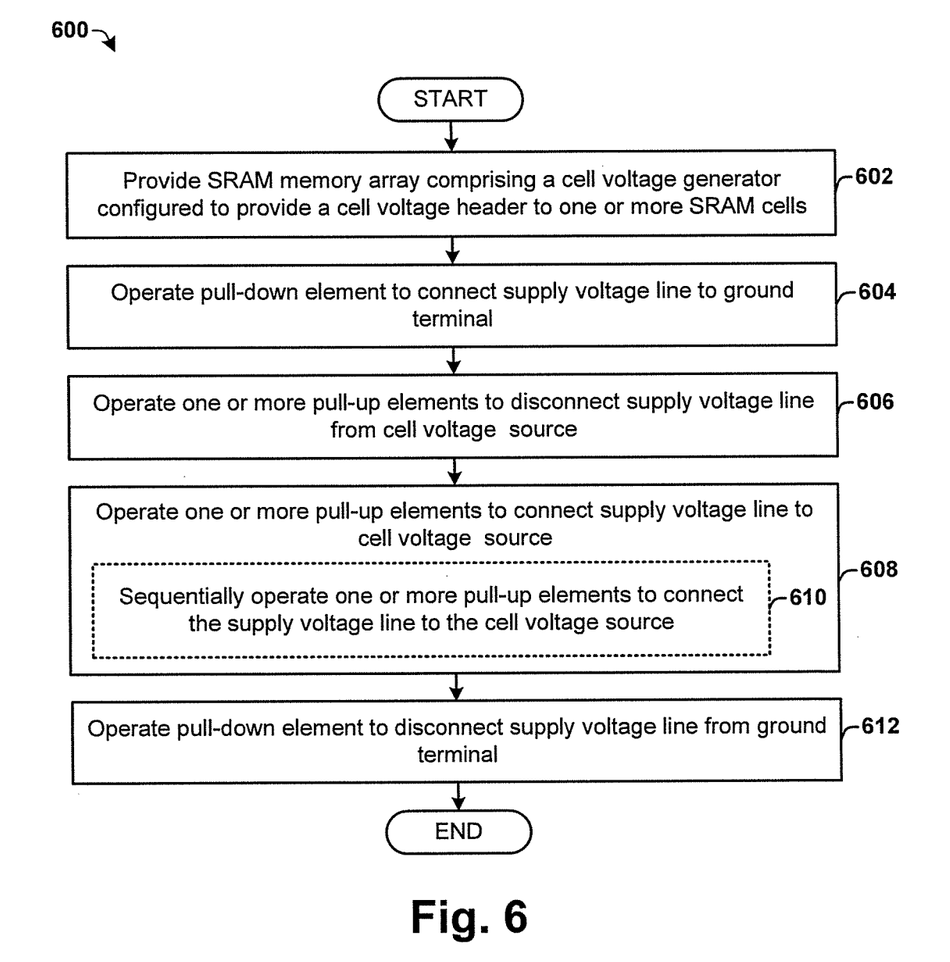
FIG. 6 shows a flow diagram of some embodiments of a method for providing a cell voltage to one or more SRAM memory cells by way of a supply voltage line.

FIG. 6 shows a flow diagram of some embodiments of a method 600 for providing a cell voltage to one or more SRAM memory cells by way of a supply voltage line.

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 602, an SRAM memory array is provided. The SRAM array comprises a cell voltage generator having a pull-down element located between a control node and a ground terminal and one or more pull-up elements located between the control node and cell voltage source. The cell voltage generator is configured to provide a cell voltage header to the control node, which is connected to one or more SRAM cells within the SRAM memory array by way of a supply voltage line. The supply voltage line provides the cell voltage header as a supply voltage to the one or more SRAM cells.

At step 604, the pull-down elements are operated to connect a supply voltage line to the ground terminal. In some embodiments, a pull-down enable signal is provided from a control unit to the pull-down element, causing the pull-down element to connect the control node of the supply voltage line to the ground terminal.

At step 606, the one or more pull-up elements are operated to disconnect a supply voltage line from the cell voltage source. In some embodiments, one or more pull-up enable signals are provided from a control unit to the one or more pull-up elements, causing the pull-up elements to separately disconnect a supply voltage line from the cell voltage source.

At step 608, the one or more pull-up elements are operated to connect the supply voltage line to the cell voltage source. In some embodiments, at step 610, the one or more pull-up elements are sequentially operated to connect the supply voltage line to the cell voltage source. For example, the pull-up enable signals may have differential pulse widths such that the values of the pull-up enable signals sequentially change so as to separately operate the one or more pull-up elements to connect the supply voltage line from the cell voltage source in a sequential manner.

At step 612, the pull-down element is operated to disconnect the supply voltage line from ground terminal. In some embodiments, disconnecting the supply voltage line from the ground terminal is achieved by changing the value of pull-down enable signal provided to the pull-down element.

Although the disclosure has been shown and described with respect to one or more implementations, equivalent alterations and modifications will occur to others skilled in the art based upon a reading and understanding of this specification and the annexed drawings. Further, it will be appreciated that identifiers such as "first" and "second" do not imply any type of ordering or placement with respect to other elements; but rather "first" and "second" and other similar identifiers are just generic identifiers. In addition, it will be appreciated that the term "coupled" includes direct and indirect coupling. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

Therefore, the present disclosure relates to a memory array having a cell voltage generator configured to provide a cell voltage header $C_{VDDHD}$ with a high slew rate (i.e., short write speed).

In some embodiments, the present disclosure relates a memory array, comprising a memory core having plurality of memory cells configured to store data. A cell voltage generator is configured to provide a cell voltage header to one or more supply voltage lines connected to the plurality of memory cells. The cell voltage generator comprises one or more voltage regulation blocks comprising a pull-down element disposed between a control node on one of the one or more supply voltage lines and a ground terminal, and a pull-up network disposed between the control node and a cell voltage source. A control unit is configured to provide one or more variable valued pull-up enable signals to the pull-up network, wherein the one or more variable valued pull-up enable signals selectively disconnect the control node from the cell voltage source.

In other embodiments, the present disclosure relates to an SRAM memory array, comprising a memory core comprising a plurality of memory cells disposed in a grid type architecture, wherein one or more of the plurality of memory cells are connected to a supply voltage line configured to provide a supply voltage to the plurality of memory cells. A pull-down element is coupled between a control node of the supply voltage line and a ground terminal and is configured to selectively provide charge from the supply voltage line to the ground terminal. One or more pull-up elements are connected in parallel between the control node and a cell voltage source and are configured to selectively provide power from the cell voltage source to the supply voltage line. A control unit is configured to provide separate pull-up enable signals to the one or more pull-up elements, wherein the separate pull-up enable signals have a value that changes over time.

In other embodiments, the present disclosure relates to a method of providing a cell voltage to one or more SRAM memory cells by way of a supply voltage line. The method comprises providing an SRAM memory array having a cell voltage generator comprising a pull-down element located between a ground terminal and a control node on the supply voltage line and one or more pull-up elements disposed between a cell voltage source and the control node. The method further comprises operating the pull-down element to connect the supply voltage line to a ground terminal. The method further comprises operating the pull-up elements to disconnect the supply voltage line from the cell voltage source. The method further comprises operating the pull-up elements to connect the supply voltage line to the cell voltage source.

What is claimed is:

1. A memory array, comprising:
   a memory core having plurality of memory cells configured to store data;
   a cell voltage generator configured to provide a cell voltage header to one or more supply voltage lines connected to the plurality of memory cells, wherein the cell voltage generator comprises one or more voltage regulation blocks comprising:
      a pull-down element disposed between a control node on one of the one or more supply voltage lines and a ground terminal;
      a pull-up network comprising a plurality of pull-up elements disposed in parallel between the control node and a cell voltage source;
   a control unit configured to provide one or more variable valued pull-up enable signals to the pull-up network, wherein the one or more variable valued pull-up enable signals selectively disconnect the control node from the cell voltage source; and
   wherein the plurality of pull-up elements are configured to respectively receive separate pull-up enable signals from the control unit comprising a first pull-up enable signal provided to a first pull-up element having a smaller pulse width than a second pull-up enable signal provided to a second pull-up element.

2. The memory array of claim 1, wherein the control unit is further configured to provide a variable valued pull-down enable signal to the pull-down element, wherein the variable valued pull-down enable signal selectively connects the control node to the ground terminal.

3. The memory array of claim 1, wherein the first pull-up enable signal and the second pull-up enable signal are activated at a same time, such that the greater pulse width of the second pull-up enable signal causes the first pull-up element to connect the control node to the cell voltage source at a later time than the first pull-up enable signal causes the second pull-up element to connect the control node to the cell voltage source.

4. The memory array of claim 1, wherein the plurality of pull-up elements comprise a plurality of PMOS transistors, wherein respective PMOS transistors have a gate configured to receive the separate pull-up enable signals from the control unit.

5. The memory array of claim 1, further comprising:
   a row decoder configured to activate a wordline to provide access to one of the plurality of memory cells prior to operating the pull-up network to connect a supply voltage line to the cell voltage source,
   wherein upon activating the wordline, charges are conveyed between a bitline or bitline bar and the memory cell.

6. The memory array of claim 1, wherein the plurality of memory cells comprise a plurality of SRAM memory cells.

7. An SRAM memory array, comprising:
   a memory core comprising a plurality of memory cells disposed in a grid type architecture, wherein one or more of the plurality of memory cells are connected to a supply voltage line configured to provide a supply voltage to the plurality of memory cells;
   a pull-down element coupled between a control node of the supply voltage line and a ground terminal and configured to selectively provide charge from the supply voltage line to the ground terminal;
   a plurality of pull-up elements connected in parallel between the control node and a cell voltage source and configured to selectively provide power from the cell voltage source to the supply voltage line; and
   a control unit configured to provide a separate respective pull-up enable signal to each of the plurality of pull-up elements, wherein each separate respective pull-up enable signal has a value that changes at a different time.

8. The memory array of claim 7, wherein the separate respective pull-up enable signals comprise a second pull-up enable signal provided to a second pull-up element having a greater pulse width than that of a first pull-up enable signal provided to a first pull-up element.

9. The memory array of claim 8, wherein the first pull-up enable signal and the second pull-up enable signal are activated at a same time, such that the greater pulse width of the second pull-up enable signal causes the second pull-up element to connect the control node to the cell voltage source at a later time than the second pull-up enable signal causes the second pull-up element to connect the control node to the cell voltage source.

10. The memory array of claim 7, wherein the plurality of pull-up elements comprise a plurality of PMOS transistors, wherein respective PMOS transistors have a gate configured to receive one of the separate pull-up enable signals from the control unit.

11. The memory array of claim 7,
   wherein the plurality of memory cells comprise a first inverter having a first PMOS transistor connected in series with a first NMOS transistor at a first data storage node and a second inverter having a second PMOS transistor connected in series with a second NMOS transistor connected in series at a second data storage node that is connected to gates of the first PMOS transistor and the first NMOS transistor, and
   wherein the first PMOS transistor and the second PMOS transistor are coupled to the supply voltage line.

12. The memory array of claim 7, further comprising:
a row decoder configured to activate a wordline to provide access to one of the plurality of memory cells prior to operating the pull-up elements to connect the supply voltage line to the cell voltage source,
wherein upon activating the wordline, charges are conveyed between a bitline or bitline bar and the memory cell.

13. The memory array of claim 7,
wherein the control unit is further configured to provide a variable valued pull-down enable signal to the pull-down element, which selectively connects the control node to the ground terminal; and
wherein the separate pull-up enable signals comprise pulsed signals having a pulse length that is smaller than a pulse length of the pull-down enable signal.

14. The memory array of claim 7, wherein the separate pull-up enable signals are activated at a same time.

15. The memory array of claim 7, wherein the plurality of memory cells comprise a plurality of SRAM memory cells.

16. A method of providing a cell voltage to one or more SRAM memory cells by way of a supply voltage line, comprising:
providing an SRAM memory array having a cell voltage generator comprising a pull-down element located between a ground terminal and a control node on the supply voltage line and one or more pull-up elements disposed between a cell voltage source and the control node;
operating the pull-down element to connect the supply voltage line to the ground terminal;
operating the pull-up elements to disconnect the supply voltage line from the cell voltage source by providing a plurality of pull-up enable signal to a plurality of pull-up elements, wherein the plurality of pull-up enable signals are activated at a same time, and have different pulse widths such that the plurality of pull-up enable signals are deactivated in a sequential order; and
operating the pull-up elements to connect the supply voltage line to the cell voltage source.

17. The method of claim 16, wherein the one or more pull-up elements comprises a plurality of pull-up elements connected in parallel between the control node and the cell voltage source.

18. The method of claim 16, further comprising:
changing value of pull-down enable signal provided to the pull-down element to operate the pull-down element to disconnect the control node from the ground terminal.

19. The method of claim 16, further comprising:
activating a wordline to provide access to one of the plurality of memory cells prior to operating the pull-up elements to connect the supply voltage line to the cell voltage source,
wherein upon activating the wordline, charges are conveyed between a bitline or bitline bar and the memory cell.

* * * * *